(12) United States Patent
Murtagh et al.

(10) Patent No.: US 7,555,668 B2
(45) Date of Patent: Jun. 30, 2009

(54) DRAM INTERFACE CIRCUITS THAT SUPPORT FAST DESKEW CALIBRATION AND METHODS OF OPERATING SAME

(75) Inventors: Paul Joseph Murtagh, Duluth, GA (US); Prashant Shamarao, Alpharetta, GA (US); Alejandro Flavio Gonzalez, Alpharetta, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 545 days.

(21) Appl. No.: 11/488,494

(22) Filed: Jul. 18, 2006

(65) Prior Publication Data

US 2008/0022145 A1    Jan. 24, 2008

(51) Int. Cl.
*G06F 1/04* (2006.01)
(52) U.S. Cl. .................. 713/503; 713/401; 713/500
(58) Field of Classification Search .................. 713/400, 713/401, 500, 501, 503, 600
See application file for complete search history.

(56) References Cited

U.S. PATENT DOCUMENTS

| 7,079,446 | B2 | 7/2006 | Murtagh et al. | |
| 2005/0066142 | A1* | 3/2005 | Bhattacharya et al. | 711/169 |
| 2006/0200598 | A1* | 9/2006 | Janzen | 710/58 |
| 2007/0006011 | A1* | 1/2007 | Martin et al. | 713/503 |

* cited by examiner

*Primary Examiner*—Dennis M Butler
(74) *Attorney, Agent, or Firm*—Myers Bigel Sibley & Sajovec

(57) ABSTRACT

A DRAM interface circuit includes a clock generation circuit configured to generate a plurality of internal clock signals and skew data in response to a plurality of data strobe signals (DQS) received at an interface of the integrated circuit device. A data capture circuit is also provided. The data capture circuit is configured to capture a plurality of data streams (DQ) associated with the plurality of data strobe signals in a manner that sufficiently reduces skew between the captured data streams so that all of the plurality of data streams may then be reliably captured in-sync with a common clock.

9 Claims, 10 Drawing Sheets

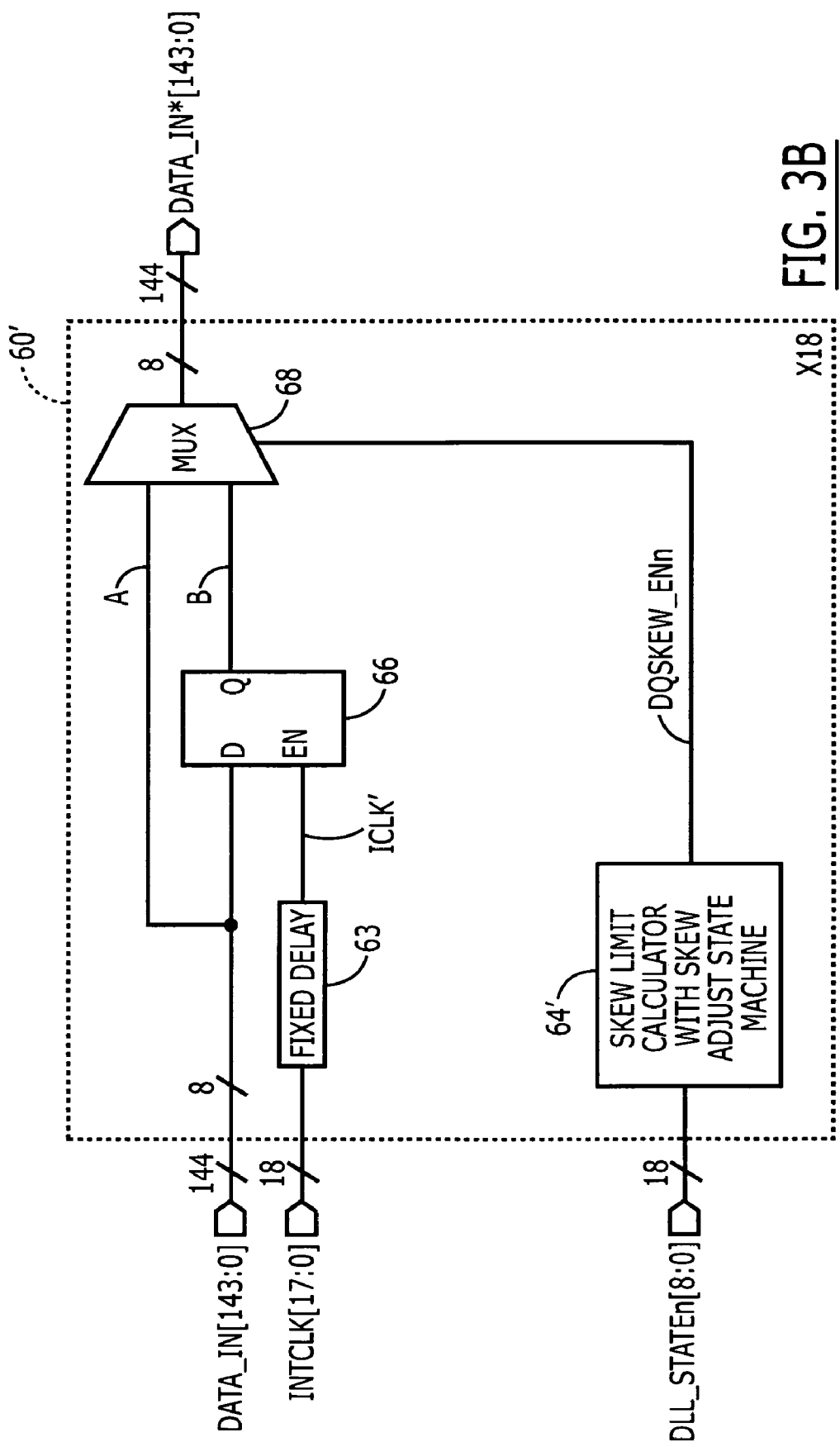

DRAM INTERFACE CIRCUITS THAT SUPPORT FAST DESKEW CALIBRATION AND METHODS OF OPERATING SAME

FIELD OF THE INVENTION

The present invention relates to integrated circuit devices and methods of operating same and, more particularly, to memory devices and methods of operating memory devices.

BACKGROUND OF THE INVENTION

A fully-buffered dual in-line memory module (FB-DIMM) may utilize an advanced memory buffer (AMB), which is typically disposed on one side of the module. An AMB may have three ports of communication. These ports include high speed serial lanes, which communicate to and from a host mother board chipset via an edge connector and possibly other FB-DIMMs, and an SMBus that provides slow speed two wire serial access for writing and reading configuration and status registers. A high speed parallel interface is also provided that supports bidirectional communication with all DRAMs on the DIMM. This FB-DIMM architecture represents the next generation of DIMMs that can increase the density and bandwidth of a single DIMM and support greater mother board expansion to include more DIMMs.

During normal modes of operation, an FB-DIMM provides no direct access from the edge connector to the DRAMs on the module. Instead, the AMB is responsible for communicating with the edge connector and generating and receiving all signals to and from the DRAMs. The AMB is also responsible for generating the correct timing of signals to and from the DRAMs. Typical AMBs may operate at a data rate from 3.2 Gb/s to 4.8 Gb/s and support as few as nine and as many as 36 DRAMs of different type, while also supporting ×4 and ×8 data width modes. In order to support this wide range in operating conditions, an AMB includes internal registers that are programmable with configuration data. These internal registers may be accessible by either the SMBus or in-band commands on the high speed serial lanes.

As will be understood by those skilled in the art, an AMB may experience reduced timing margins when the FB-DIMM is running at its maximum speed (e.g., the 4.8 Gb/s rate translates to a 400 MHz DRAM clock or an 800 Mb/s DDR data interface). At this maximum speed, the clock period is nominally 2.5 ns, and the half period or data eye maximum is 1.25 ns. Generating signals that meet these reduced timing margins is difficult because of the presence of timing skew between data, address, command, strobe and clock signals generated to and from the DRAMs. This timing skew is at least partially caused by the physical line length differences between the AMB and the closest and farthest DRAMs on both sides of the DIMM.

Referring now to FIG. 1, an integrated circuit system 100 is illustrated as including a dual in-line memory module (DIMM) 30 that communicates with a host processor 10 via a high speed serial bus (HSS_BUS) and an SMBus that provides two-wire serial access for writing and reading configuration and status registers within a memory buffer 20 on the DIMM 30. The memory buffer 20 and a plurality of DRAMs 22_1 to 22_8 are disposed on the DIMM 30. The DRAMs 22_1 to 22_8 are coupled to the memory buffer 20 by a high speed parallel interface. These DRAMs 22_1 to 22_8 are illustrated as being disposed on one side of a printed circuit board having an edge connector 32 that may be configured to be received within a dual in-line connector mounted on a mother board (not shown). Additional DRAMs may also be provided on both sides of the DIMM 30.

As illustrated by FIG. 2A, the memory buffer 20 includes a buffer control circuit 24 and a DRAM interface circuit 26. The buffer control circuit 24 includes a multi-lane I/O interface, which supports coupling to the high speed serial bus (HSS_BUS). This multi-lane I/O interface may include fully-buffered I/O drivers and phase-locked loop (PLL) integrated circuits that are configured to receive a reference clock signal (REFCLK). The buffer control circuit 24 also includes user accessible configuration and status registers (not shown). An exemplary DRAM interface circuit 26, which receives control signals from the configuration and status registers, is more fully illustrated by FIG. 2B. This DRAM interface circuit 26 includes a plurality of driver circuits that service a front side of the DIMM 30 and a plurality of driver circuits that service a back side of the DIMM 30. With respect to the front side (side A) of the DIMM 30, the driver circuits include a first clock driver circuit 28-1, a first address driver circuit 28-2, first command driver circuits 28-3 and 28-4 and a front on-die termination (ODTA) driver circuit 28-5. With respect to the back side (side B) of the DIMM 30, the driver circuits include a second clock driver circuit 28-6, a second address driver circuit 28-7, second command driver circuits 28-8 and 28-9 and a back on-die termination (ODTB) driver circuit 28-10. A ×18 data and strobe driver circuit 28-11 is also provided, which is responsive to eighteen multi-bit data skew control signals dout_ctl[8:0] and eighteen multi-bit strobe skew control signals dqs_ctl [8:0]. These skew control signals may be stored within the user accessible configuration registers. These multi-bit skew control signals may support a skew resolution of 6.5 ps in 384 steps, which covers one full period of an interface clock signal operating at 400 MHz.

The first clock driver circuit 28-1 is a ×2 circuit (i.e., includes two copies of the elements illustrated within the dotted box), with each circuit including a phase interpolator (PI), a flip-flop having complementary outputs and a pair of output buffers/drivers that generate a corresponding pair of true and complementary clock signals CLK and CLK#. FIG. 2C illustrates an exemplary output buffer/driver 32 that can be used in the first clock driver circuit 28-1. This output buffer/driver 32 may include a pre-driver stage and an output driver stage connected in series, with the pre-driver stage being responsive to the slew rate control signal (slew_ctl) and the output driver stage being responsive to the output impedance control signal (imp_ctl). In particular, the pre-driver stage may be configured so that the slew rate of its output can be set in response to the slew rate control signal (slew_ctl) and the pull-up and pull-down impedances of the output driver stage can be set in response to the output impedance control signal (imp_ctl). These control signals (slew_ctl and imp_ctl) provide the same degree of independent control as the various skew control signals described herein. The output buffer/driver 32 may be of conventional design and need not be described further herein.

Each phase interpolator (PI) in the first clock driver circuit 28-1 is configured to receive a plurality of timing signals. As illustrated, these timing signals include three phases of an interface clock signal (e.g., 400 MHz clock signal) generated by a phase-locked loop (PLL) integrated circuit (not shown). The three phases are separated by 60° relative to each other. From these three phases, each phase interpolator may generate three additional phases by inverting each of the illustrated timing signals. In this manner, a total of six phases may be generated that are separated by 60°. In alternative embodiments, all six phases may be generated by the PLL integrated circuit and provided as timing signals to the illustrated phase interpolators (PI).

Each phase interpolator is also responsive to a respective multi-bit clock skew control signal (clk_ctl), which controls the phase of the periodic signal at the output of the phase interpolator. This output is provided as a clock signal to a corresponding flip-flop. In this manner, the values of the clock skew control signals (clk_ctl) operates to set the phases of the complementary outputs of the flip-flops and the phases of the true and complementary clock signals (CLK[0], CLK[0]#) and (CLK[2], CLK[2]#).

The first address driver circuit 28-2 is a ×19 circuit (i.e., includes nineteen copies of the elements illustrated within the dotted box), with each circuit including a flip-flop having a true output and an output buffer/driver that generates a corresponding bit of an address signal (column and row address (A) and bank address (BA)). The output buffer/driver may be as illustrated by FIG. 2C and described hereinabove. Unlike the first clock driver circuit 28-1, only one phase interpolator (PI) is used in the first address driver circuit 28-2. The phase interpolator, which is responsive to the plurality of timing signals and the address skew control signal (addr_ctl), sets the skew associated with all nineteen bits of the address signals (A[15:0]A, BA[2:0]A).

The command driver circuit 28-3 is a ×3 circuit (i.e., includes three copies of the elements illustrated within the dotted box), with each circuit including a flip-flop having a true output and an output buffer/driver that generates a corresponding command. The three flip-flops are configured to receive a front side row address strobe input signal (ras), a front side column address strobe input signal (cas) and a front side write enable input signal (we), respectively. The generated commands include an active low row address strobe signal RAS#A, an active low column address strobe signal CAS#A and an active low write enable signal WE#A, which are provided to the front side of the DIMM 30. The phase interpolator, which is responsive to the plurality of timing signals and a command skew control signal (rascaswe_ctl), sets the skew associated with all three commands (RAS#A, CAS#A and WE#A).

The command driver circuit 28-4 is a ×4 circuit (i.e., includes four copies of the elements illustrated within the dotted box), with each circuit including a flip-flop having a true output and an output buffer/driver that generates a corresponding command. The four flip-flops are configured to receive a pair of chip select signals and a pair of clock enable signals (cs and cke, which correspond to cs[1:0]#A and cke[1:0]A). The phase interpolator, which is responsive to the plurality of timing signals and a command skew control signal (cscke_ctl), sets the skew associated with all four commands (CS[1:0]#A and CKE[1:0]A). The skews of CS[0]#A and CKE[0]A may be set independently of CS[1]#A and CKE[1]A.

The front on-die termination (ODTA) driver circuit 28-5 includes a flip-flop having a true output and an output buffer/driver that generates a corresponding on-die termination signal (ODTA) for the front side of the DIMM 30. The flip-flop is configured to receive an on-die termination signal (odt) for the front side. The phase interpolator, which is responsive to the plurality of timing signals and an ODT skew control signal (odt_ctl), sets the skew associated the front on-die termination signal (ODTA).

The second clock driver circuit 28-6 is a ×2 circuit (i.e., includes two copies of the elements illustrated within the dotted box), with each circuit including a phase interpolator (PI), a flip-flop having complementary outputs and a pair of output buffers/drivers that generate a corresponding pair of true and complementary clock signals CLK and CLK#. FIG. 2C illustrates an exemplary output buffer/driver circuit 32 that can be used in the second clock driver circuit 28-6. Each phase interpolator (PI) in the second clock driver circuit 28-6 is configured to receive the plurality of timing signals. Each phase interpolator is also responsive to a respective multi-bit clock skew control signal (clk_ctl) for the back side of the DIMM 30. The values of the two clock skew control signals (clk_ctl) for the back side operate to set the phases of the complementary outputs of the flip-flops and the phases of the true and complementary clock signals (CLK[1], CLK[1]#) and (CLK[3], CLK[3]#).

The second address driver circuit 28-7 is a ×19 circuit (i.e., includes nineteen copies of the elements illustrated within the dotted box), with each circuit including a flip-flop having a true output and an output buffer/driver that generates a corresponding bit of an address signal (column and row address (A) and bank address (BA)) for the back side. The output buffer/driver may be as illustrated by FIG. 2C and described hereinabove. Unlike the first clock driver circuit 28-1, only one phase interpolator (PI) is used in the second address driver circuit 28-7. Thus, the fanout at the output of the phase interpolator is nineteen. The phase interpolator, which is responsive to the plurality of timing signals and the address skew control signal (addr_ctl) for the back side, sets the skew associated with all nineteen bits of the address signals (A[15:0]B, BA[2:0]B).

The command driver circuit 28-8 is a ×3 circuit (i.e., includes three copies of the elements illustrated within the dotted box), with each circuit including a flip-flop having a true output and an output buffer/driver that generates a corresponding command. The three flip-flops are configured to receive a back side row address strobe input signal (ras), a back side column address strobe input signal (cas) and a back side write enable input signal (we), respectively. The generated commands include an active low row address strobe signal RAS#B, an active low column address strobe signal CAS#B and an active low write enable signal WE#B for the back side of the DIMM 30. The phase interpolator, which is responsive to the timing signals and a command skew control signal (rascaswe_ctl) for the back side, sets the skew associated with all three commands (RAS#B, CAS#B and WE#B).

The command driver circuit 28-9 is a ×4 circuit (i.e., includes four copies of the elements illustrated within the dotted box), with each circuit including a flip-flop having a true output and an output buffer/driver that generates a corresponding command. The four flip-flops are configured to receive a pair of chip select signals and a pair of clock enable signals for the back side (cs and cke, which correspond to cs[1:0]#B and cke[1:0]B). The phase interpolator, which is responsive to the timing signals and a command skew control signal (cscke_ctl) for the back side, sets the skew associated with all four commands (CS[1:0]#B and CKE[1:0]B).

The back on-die termination (ODTB) driver circuit 28-10 includes a flip-flop having a true output and an output buffer/driver that generates a corresponding on-die termination signal (ODTB) for the back side of the DIMM 30. The flip-flop is configured to receive an on-die termination signal (odt) for the back side. The phase interpolator, which is responsive to the timing signals and an ODT skew control signal (odt_ctl) for the back side, sets the skew associated the back on-die termination signal (ODTB).

The data and strobe DDR driver circuit 28-11 is a ×18 circuit that is configured to receive 144 bits of output data dout[143:0] on 72 data lines operating at dual data rates and generate data and check bits CB[7:0] and DQ[63:0] on eighteen groups of four data output lines. Each of the eighteen DDR driver circuits contains a respective ×4 bidirectional data driver circuit therein that is responsive to both rising and falling edges of a synchronizing signal generated by a respective phase interpolator (PI), which is responsive to a respective data out skew control signal (dout_ctl). The eighteen data out skew control signals dout_ctl[8:0] support independent skew control for eighteen groups of four output data lines. As illustrated, the ×4 bidirectional data driver circuit includes flip-flops and an output buffer in the output path and an input buffer and flip-flops in the input path. The output buffer is responsive to an output enable signal (OE), which supports a high impedance output state. This output buffer also supports slew rate and output impedance control as illustrated by FIG. 2C.

The data and strobe DDR driver circuit 28-11 is also configured to generate 18 pairs of data strobe signals (DQS[17:0] and DQS[17:0]#) when the DRAM interface circuit 26 is writing data to the DRAMs 22_1 to 22_7 and receive data strobe signals when reading and capturing data read from the DRAMs 22_1 to 22_7. The data strobe signal lines are driven by eighteen pairs of output buffers that are responsive to an output enable signal (OE). Like the output buffer in the ×4 bidirectional data driver circuit, each pair of output buffers supports slew rate and output impedance control as illustrated by FIG. 2C. The timing of each pair of data strobe signal lines (DQS and DQS#) is controlled by a respective phase interpolator (PI). Each of the eighteen phase comparators is responsive to a respective one of the eighteen data strobe skew control signals dqs_ctl[8:0].

The control of timing to the data receiving portion of the ×4 bidirectional data driver circuit also supports eighteen independent offsets in the capture of read data (din[143:0]). These offsets are controlled by the eighteen 9-bit offset control signals offset_ctl[8:0], which are provided to a DLL finite state machine (FSM). This DLL FSM generates outputs that are provided to the eighteen phase interpolators associated with the ×4 bidirectional data driver circuits and the eighteen phase interpolators associated with the incoming strobe signals (DQS[17:0], DQS[17:0]#) received from the DRAMs 22_1 to 22_7.

SUMMARY OF THE INVENTION

Integrated circuits according to embodiments of the invention include interface circuits (e.g., DRAM interface circuits) that support fast deskew calibration during built-in self-test (BIST) operations. According to these embodiments, an integrated circuit device may include a clock generation circuit configured to generate a plurality of internal clock signals and skew data in response to a plurality of data strobe signals (DQS) received at an interface of the integrated circuit device. A data capture circuit is also provided. The data capture circuit is configured to capture a plurality of data streams (DQ) associated with the plurality of data strobe signals in a manner that sufficiently reduces skew between the captured data streams so that all of the plurality of data streams may then be reliably captured in-sync with a common clock. The data capture circuit includes a skew control circuit, which is responsive to the skew data. This skew control circuit is configured to determine a fast skew limit in response to identifying a second internal clock signal having a relatively slow skew when compared to a first internal clock signal having a relatively fast skew. The relatively slow skew may be a slowest skew and the relatively fast skew may be a fastest skew. The skew control circuit is further configured to reduce a skew difference between a first data stream associated with the first internal clock signal and a second data stream associated with the second internal clock signal, by capturing the first data stream in-sync with a phase-delayed version of the first internal clock signal having a skew that lags the fast skew limit. In this manner, the maximum skew difference between the captured data associated with multiple data streams can be reduced below the fast skew limit.

According to some of these embodiments of the invention, the skew control circuit is configured to determine the fast skew limit as a limit that is 180° (i.e., ½T, where T is a period of the data strobe signals) in advance of the second internal clock signal. In this case, the skew control circuit may be configured to delay by 180° a skew of all of the plurality of internal clock signals having skews in advance of the fast skew limit. By delaying the skews by 180°, the maximum skew difference between all of the captured data streams can be maintained below 180°.

According to other embodiments of the invention, the skew control circuit determines the fast skew limit by identifying a slowest one of the plurality of internal clock signals based on the skew data and measuring a fixed number of degrees (e.g., 120°, 180°, etc.) in advance of the skew associated with the slowest one of the plurality of internal clock signals. The skew control circuit is further configured to identify each of the plurality of internal clock signals having a skew in advance of the fast skew limit and then generate phase-delayed versions of each of the plurality of internal clock signals identified as having a skew in advance of the fast skew limit. These phase-delayed versions of each of the plurality of internal clock signals identified as having skews in advance of the fast skew limit are sufficiently delayed so that all of them have skews that lag the fast skew limit.

According to additional embodiments of the invention, the skew control circuit is configured to identify a slowest one of the plurality of internal clock signals and is further configured to reduce skew difference between a first data stream associated with first one of the plurality of internal clock signals and a second data stream associated with the slowest one of the plurality of internal clock signals by capturing the first data stream in-sync with a phase-delayed version of the first one of the plurality of internal clock signals.

Still further embodiments of the invention include methods of reducing skew between a plurality of data streams. These methods include determining relative skews between a plurality of clock signals having equivalent frequency. Based on these relative skews, a slowest one of the plurality of clock signals is identified. A fast skew limit is determined relative to the slowest one of the plurality of clock signals. A first one of the plurality of clock signals having a skew that is faster than the slowest one of the plurality of clock signals by a skew amount greater than the fast skew limit is also identified. A delayed version of this clock signal is generated. During a data capture operation, first data is captured in-sync with the slowest one of the plurality of clock signals and second data is captured in-sync with a delayed version of the first one of the plurality of clock signals having a skew less than the fast skew limit.

BRIEF DESCRIPTION OF THE DRAWINGS

FIG. 3B is an electrical schematic of an alternative skew control circuit according to embodiments of the present invention.

DESCRIPTION OF PREFERRED EMBODIMENTS

Figure 1:
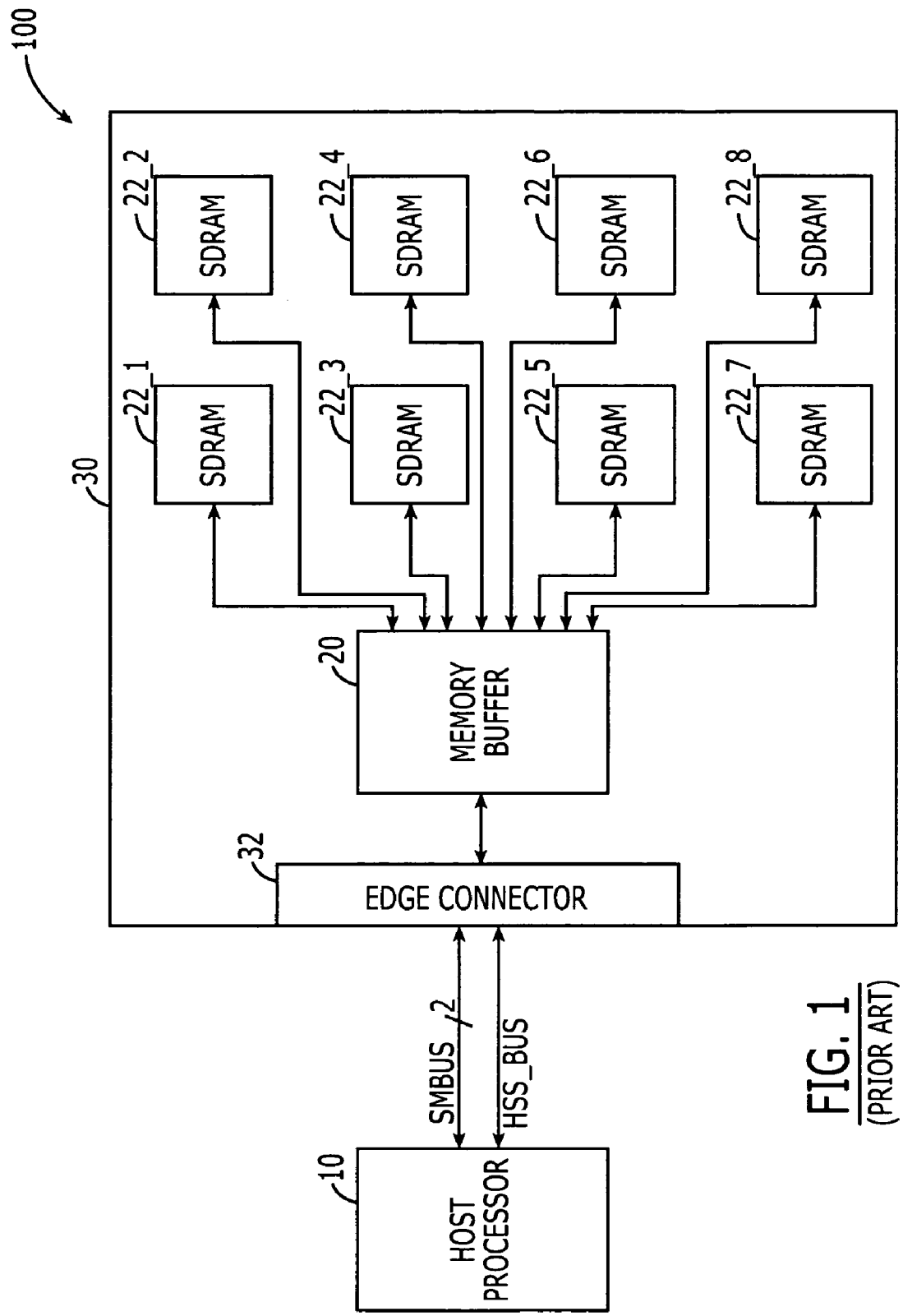
FIG. 1 is a block diagram of an integrated circuit system having a dual in-line memory module (DIMM) therein, according to the prior art.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix "#" (or prefix symbol "/") to a signal name may also denote a complementary data or information signal or an active low control signal, for example.

Figure 2A:
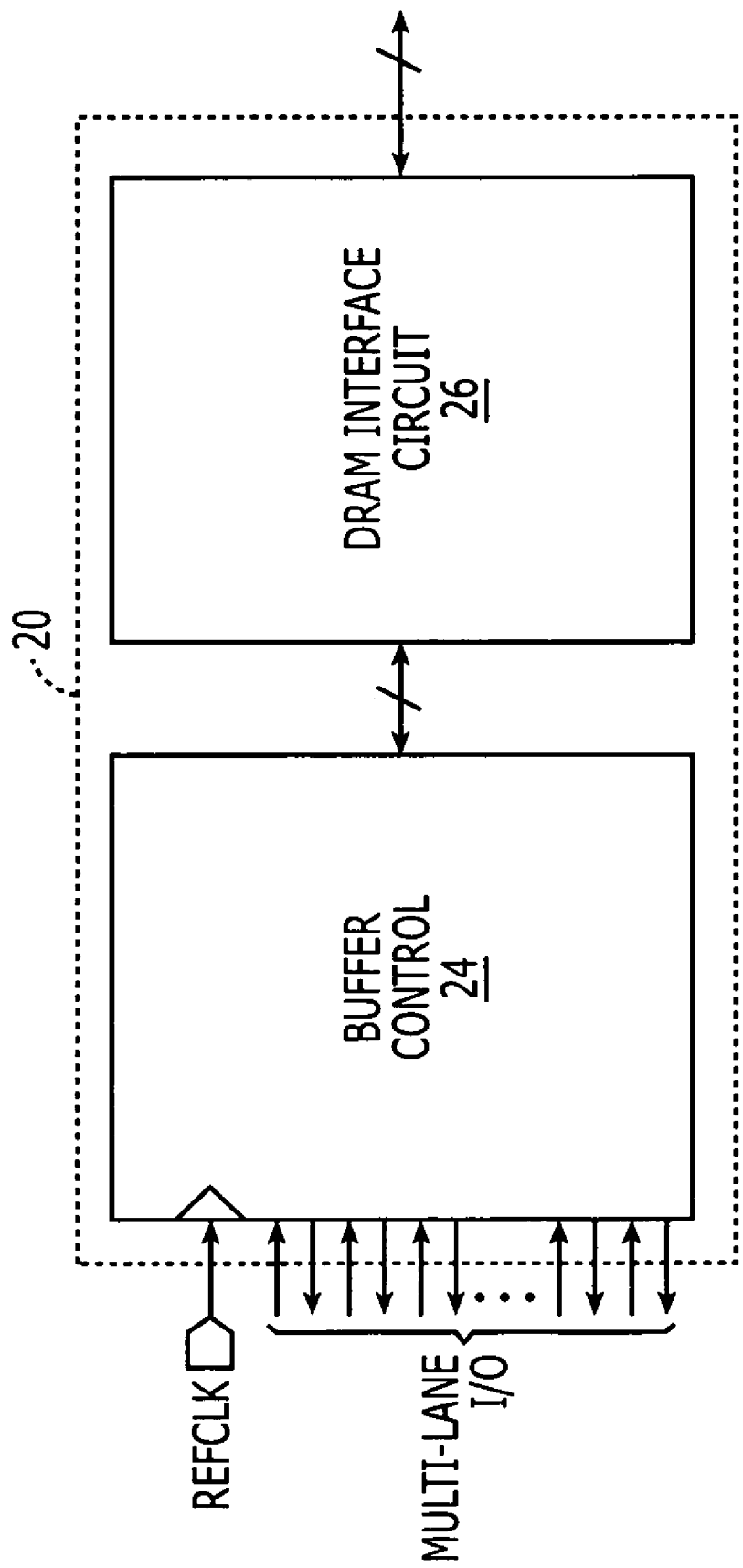
FIG. 2A is a block diagram of a memory buffer according to the prior art.
Figure 2B:
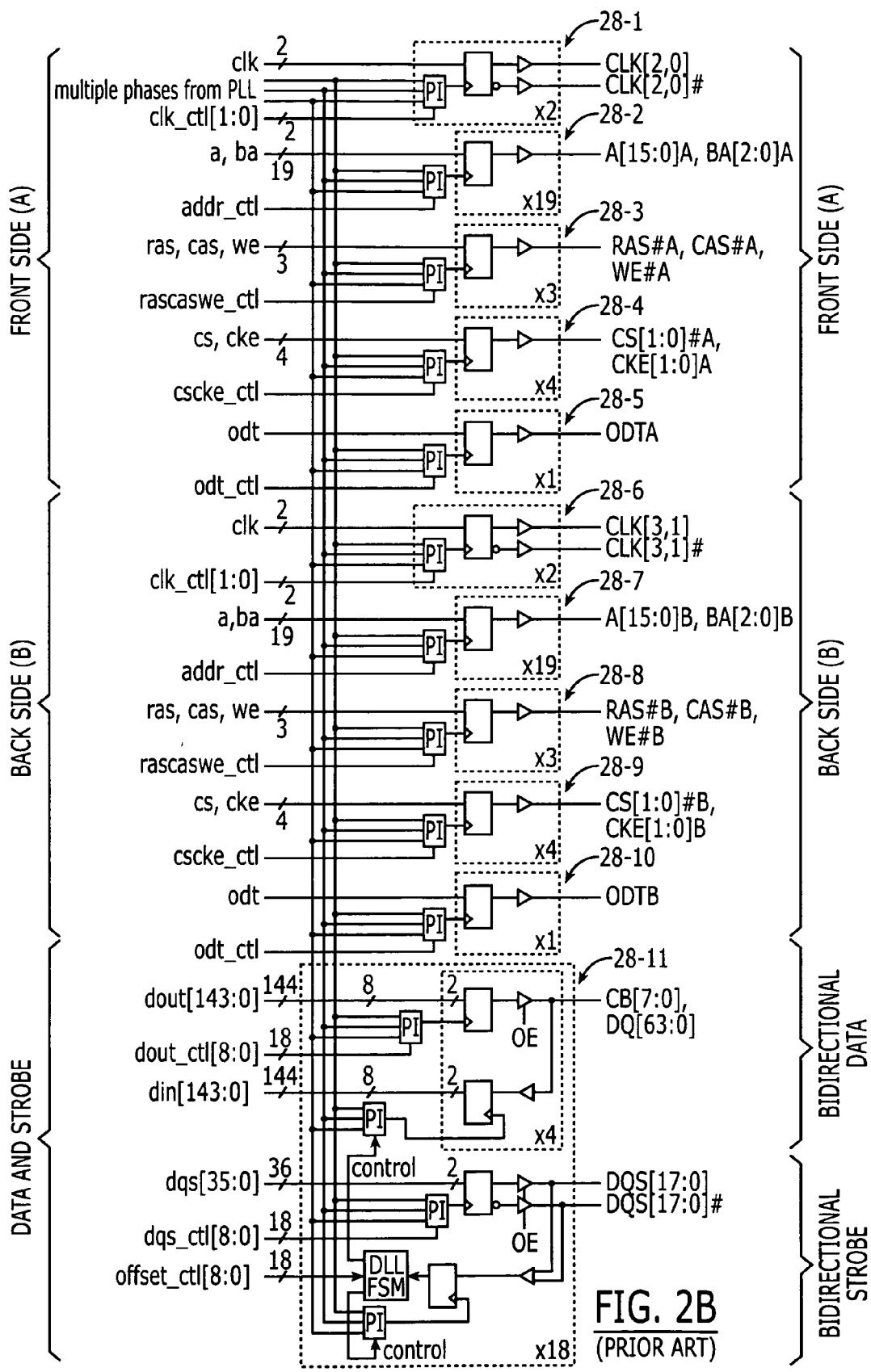
FIG. 2B is an electrical schematic of the DRAM interface circuit of FIG. 2A.
Figure 2C:
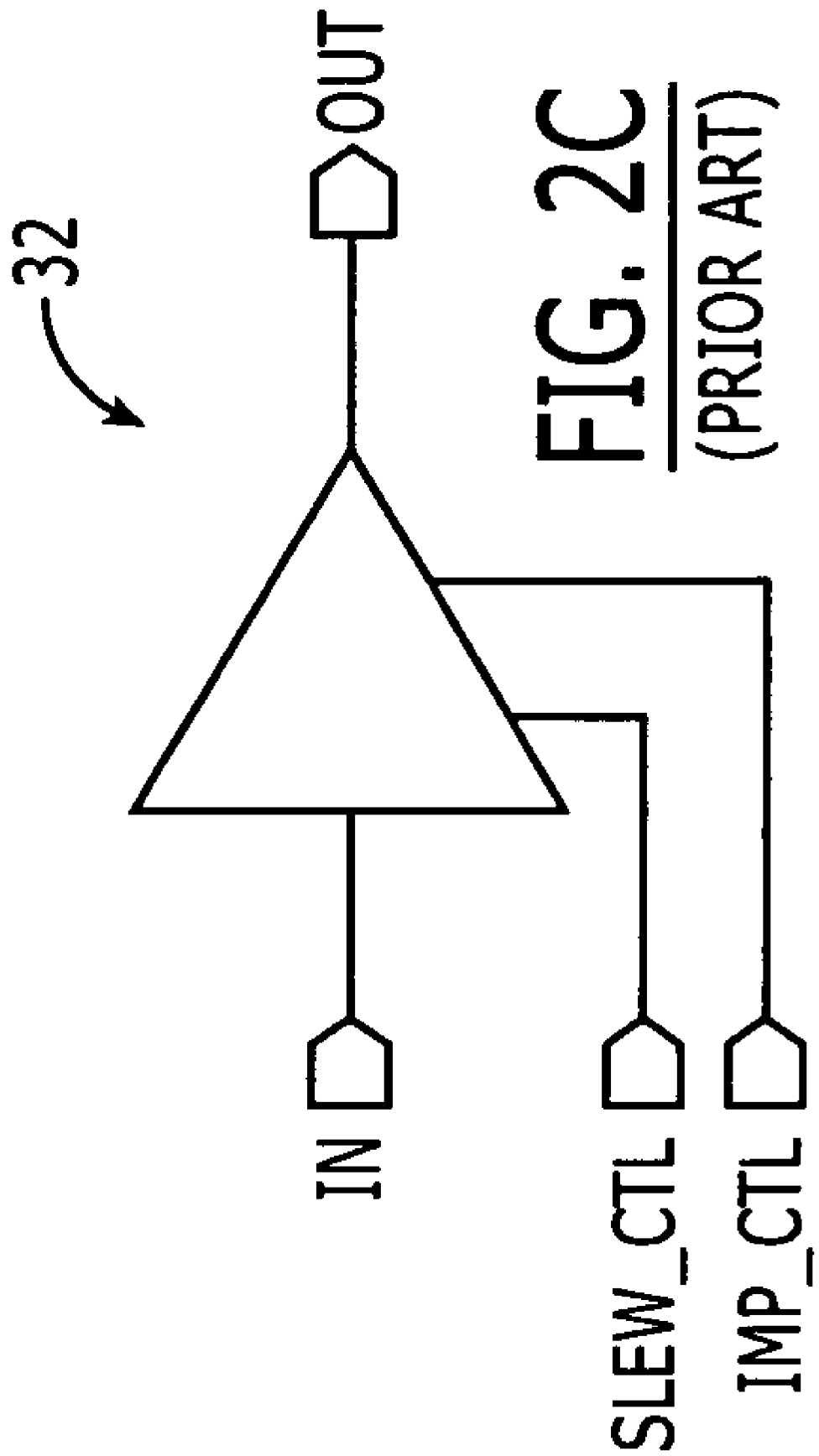
FIG. 2C is an electrical schematic of a conventional output buffer/driver having slew rate and impedance control.
Figure 2D:
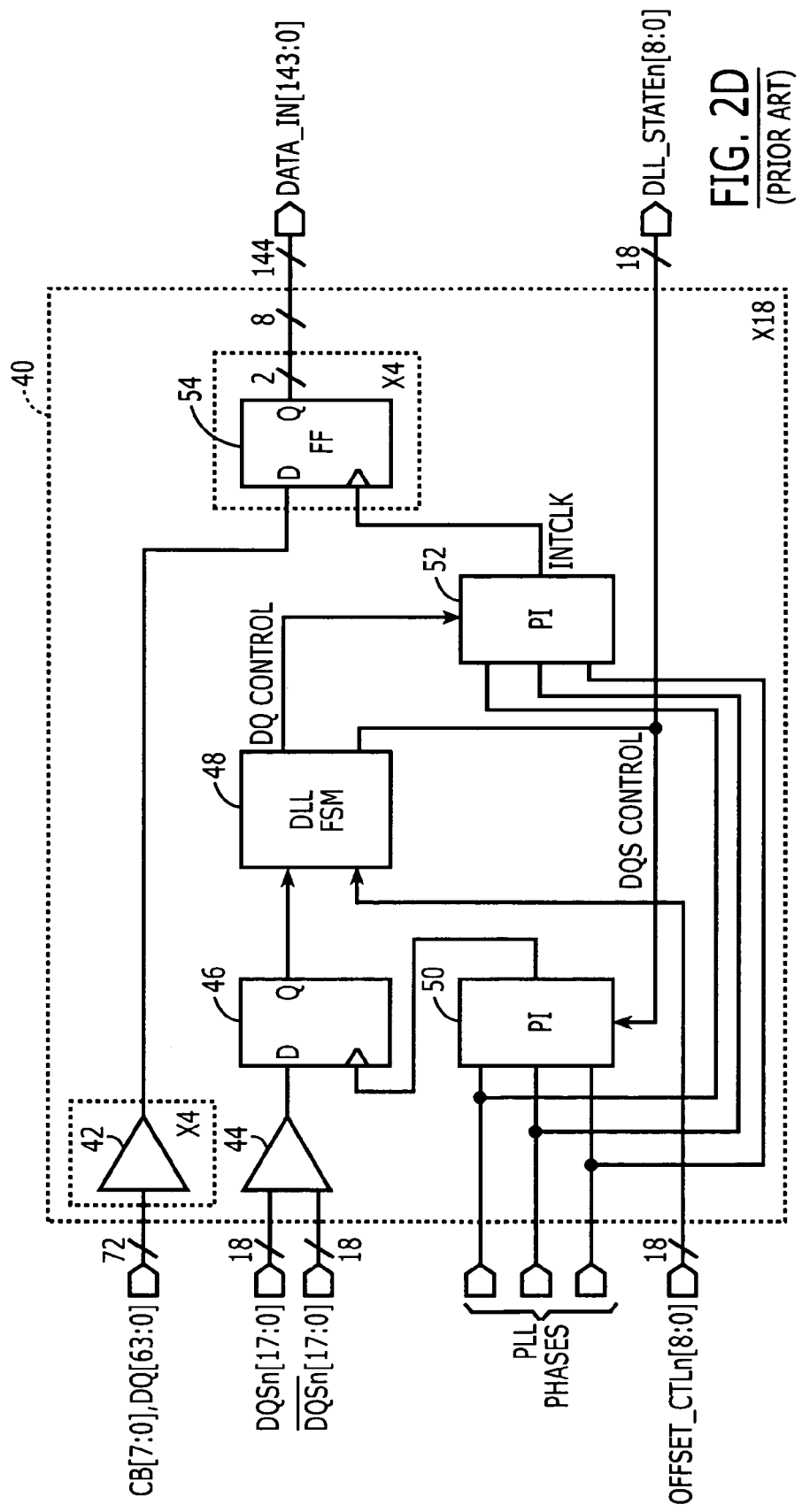
FIG. 2D is an electrical schematic of a portion of the interface circuit of FIG. 2B, which highlights processing of data and strobe signals.
Figure 3A:
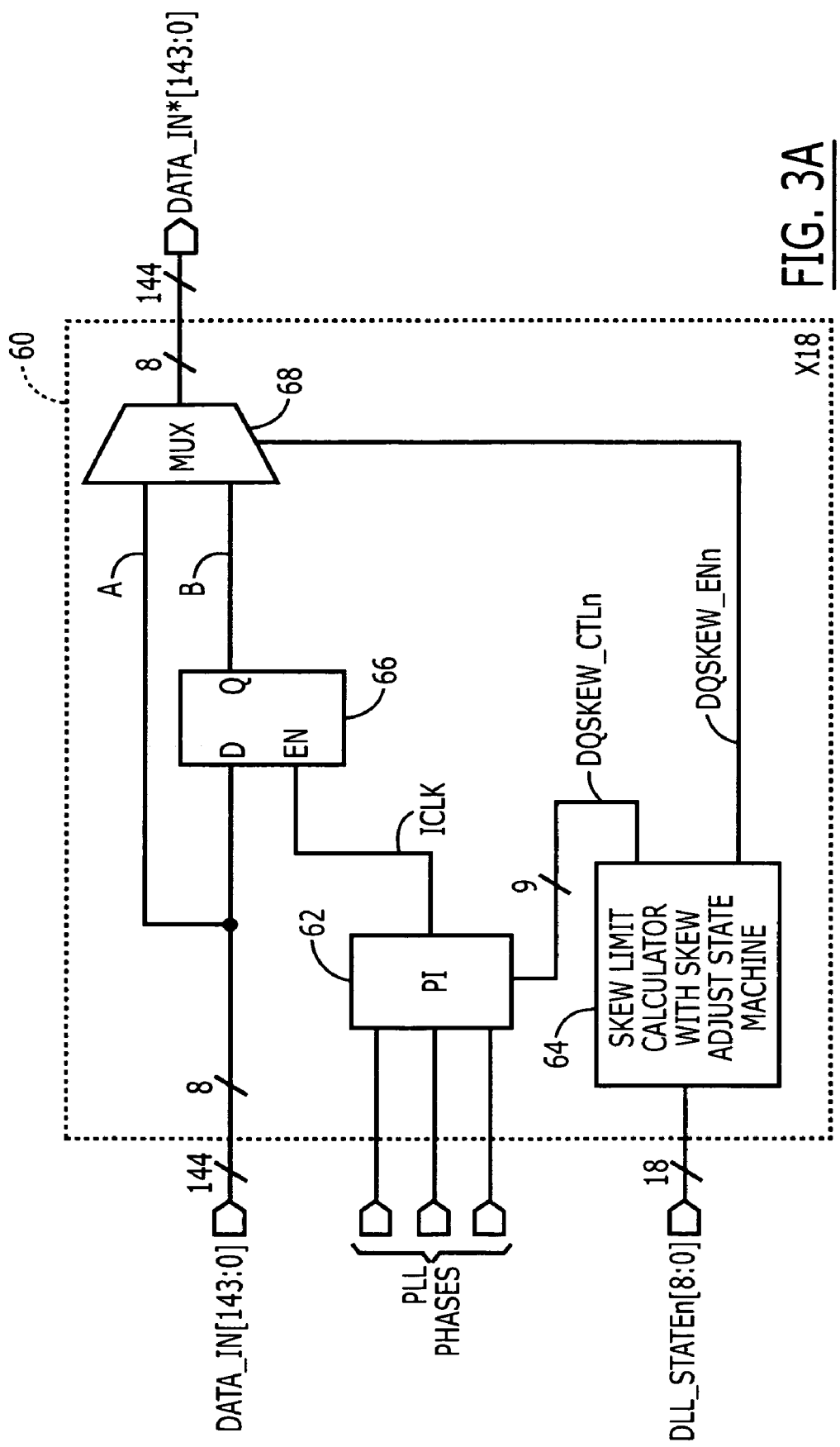
FIG. 3A is an electrical schematic of a skew control circuit according to embodiments of the present invention.

Embodiments of the present invention include interface circuits (e.g., DRAM interface circuits) that support fast deskew calibration during built-in self-test (BIST) operations. As illustrated by FIGS. 2D and 3A, an integrated circuit device according to some embodiments of the invention includes a clock generation circuit and a data capture circuit. The clock generation circuit is configured to generate a plurality of internal clock signals (INTCLK) and skew data (DLL_STATEn[8:0]) in response to a plurality of data strobe signals (DQSn[17:0] and /DQSn[17:0]) received at an interface of the integrated circuit device. These data strobe signals are illustrated in FIG. 2D as eighteen pairs of differential "clock" signals. The data capture circuit is configured to capture a plurality of data streams (DQ[63:0]) (and check bits (CB[7:0])) associated with the plurality of data strobe signals in a manner that reduces the skew between the captured data streams. As described herein, the data capture operations performed by the data capture circuit include an initial data capture followed by operations to recapture the initially captured data in order to improve the overall skew characteristics of the data (e.g., narrow the overall range of skews between the initially captured data signals). In particular, the degree of skew reduction that is achieved by the data capture operations is sufficient to enable all of the plurality of data streams to be reliably synchronized (e.g., recaptured) with a common clock signal. Elements of the clock generation circuit and data capture circuit are identified by the reference numbers 40 and 60 in FIGS. 2D and 3A.

The data capture circuit is illustrated as including a skew control circuit 60, which is responsive to the skew data (DLL_STATEn[8:0]). The data capture circuit also includes a plurality of data input buffers 42 that receive input data (CB[7:0] and DQ[63:0]) at an interface of an integrated circuit and a corresponding plurality of latch elements 54 that initially capture the input data in-sync with rising and falling edges of corresponding ones of the plurality of internal clock signals (INTCLK). These internal clock signals (INTCLK) may be generated by the clock generation circuit. As illustrated by FIG. 2D (and FIG. 2B), one configuration of a conventional clock generation circuit includes a plurality of clock input buffers 44, which receive the data strobe signals having different skews that may vary as much as one period of the data strobe signals. These received data strobe signals are processed through corresponding D-type flip-flop latching units 46. These D-type flip-flop latching units 46 are synchronized by outputs of a corresponding plurality of first phase interpolators (PI) 50, which receive multiple phases of an interface clock signal generated by a phase-locked loop integrated circuit (not shown). The outputs of the latching units 46 and corresponding skew offset control signals (OFFSET_CTLn[8:0]) are provided as inputs to a DLL finite state machine (FSM) 48, which generates data control signals (DQ Control) and strobe control signals (DQS Control). The strobe control signals (DQS Control), which are treated herein as the 9-bit skew data (DLL_STATE[8:0]), are provided as control inputs to the first phase interpolators 50. The data control signals are provided as control inputs to a corresponding plurality of second phase interpolators 52, which generate the internal clock signals INTCLK. These aspects of the clock generation circuit are more fully illustrated and described in commonly assigned U.S. application Ser. No. 10/916,901, filed Aug. 12, 2004, now U.S. Pat. No. 7,079,446, the disclosure of which is hereby incorporated herein by reference.

Additional portions of the data capture circuit are illustrated by the skew control circuit 60 of FIG. 3A. This skew control circuit 60 includes a skew limit calculator with skew adjust state machine 64 that receives the 9-bit skew data (DLL_STATEn[8:0]). This 9-bit skew data encodes the relative skew information associated with the eighteen internal clock signals (INTCLK) generated by the second phase interpolators 52. This relative skew information is also reflected in the relative skews associated with the initially captured data streams (i.e., DATA_IN[143:0], which includes eighteen groups of eight data streams) generated by the latch elements 54. The state machine 64 generates eighteen 9-bit skew control signals (DQSKEW_CTLn) and eighteen 1-bit skew adjust enable signals DQSKEW_ENn. The skew control signals (DQSKEW_CTLn) are provided to corresponding third phase-interpolators 62.

As illustrated and described more fully hereinbelow with respect to FIGS. 4 and 5A-5D, these third phase interpolators 62 generate a corresponding plurality of clock signals ICLK that are more closely aligned in phase relative to the internal clock signals INTCLK generated by the second phase interpolators 52. These clock signals ICLK will be treated herein as including phase delayed versions of the internal clock signals INTCLK. The D-type flip-flop latching units 66 resynchronize the initially captured data streams (i.e., DATA_IN[143:0]) to the clock signals ICLK generated by the third phase interpolators 62. The outputs of the D-type flip-flop latching units 66 are provided to the multiplexer units 68, which select between the eighteen groups of eight data streams. This selection is based on the values of the eighteen 1-bit skew adjust enable signals DQSKEW_ENn generated by the state machine 64. In this manner, the realigned data streams (DATA_IN*[143:0]) generated at an output of the multiplexer units 68 represent a more closely aligned group of data streams that can be accurately synchronized with a single clock. Some of these data streams (identified as "A" streams) are unaltered by the skew control circuit 60 and other ones of these data streams (identified as "B" streams) are delayed in time in order to improve their skew relative to the unaltered data streams.

An alternative skew control circuit 60' is illustrated by FIG. 3B. This skew control circuit 60' simplifies the generation of the delayed data streams (the "B" streams) by using fixed delay units 63 to delay the internal clock signals INTCLK[17:0] generated by the second phase interpolators 52. These fixed delay units 63 may provide a delay equivalent to a substantial portion of a period of the internal clock signals. For example, if the fixed delay units 63 provide a delay equivalent to ½T, where T is a period of the internal clock signals, then each of the delayed data streams B generated by the D-type flip-flop latching units 66 will be delayed by 180° relative to their counterparts in the "A" streams. Accordingly, the eighteen 1-bit skew adjust enable signals DQSKEW_ENn (generated by the skew limit calculator with skew adjust state machine 64') will cause each of the multiplexer units 68 to select between an 8-stream group of the initially captured input data DATA_IN[143:0] or a corresponding version of the initially captured data that is delayed by 180°.

Figure 4:
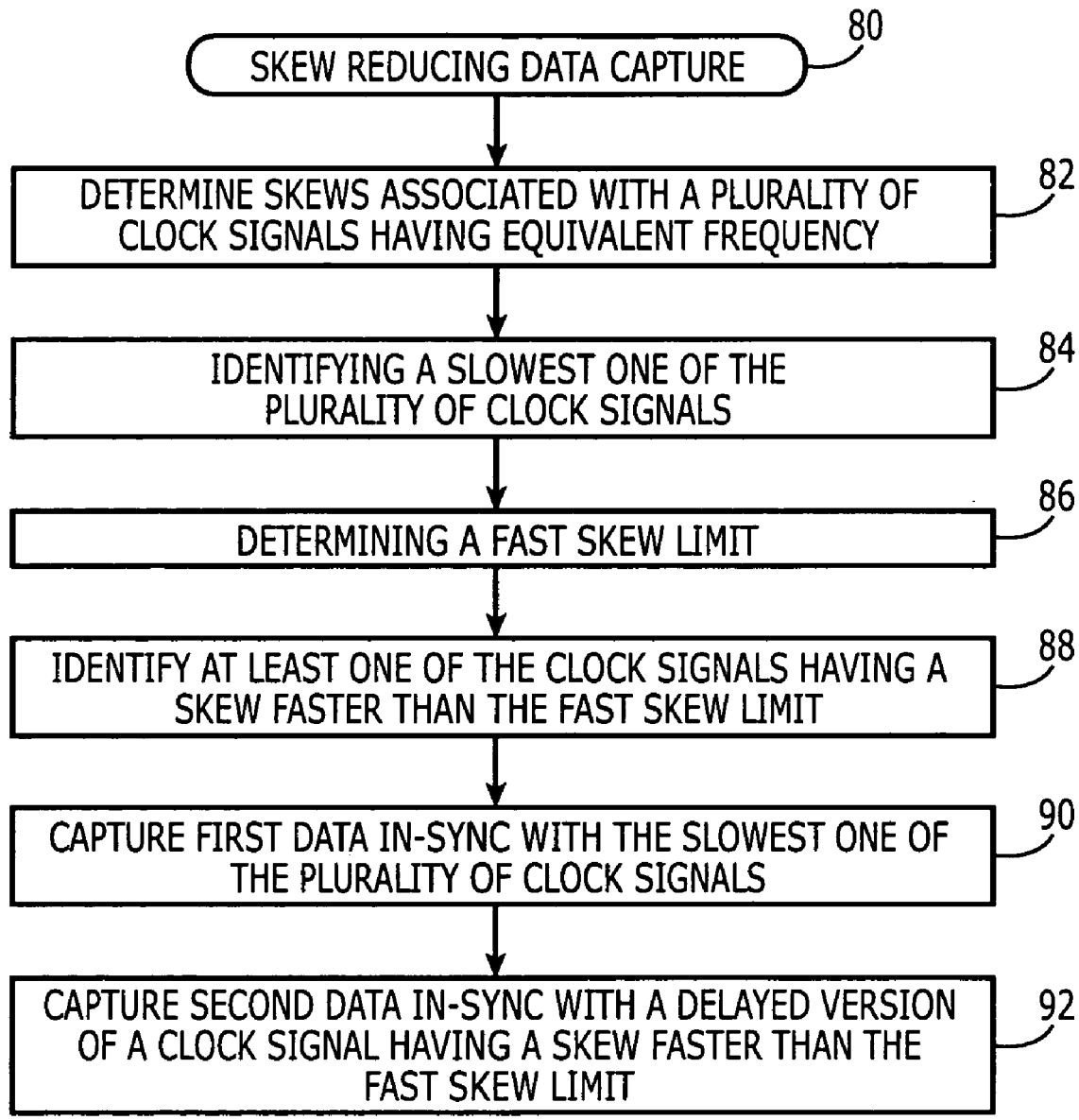
FIG. 4 is a flow diagram that illustrates operations performed by the skew control circuit of FIG. 3A.

Operation of the skew control circuits 60, 60' of FIGS. 3A-3B will now be described more fully with respect to FIGS. 4 and 5A-5D. In particular, FIG. 4 illustrates skew reducing data capture operations 80 performed by the skew control circuits 60, 60' and FIGS. 5A-5D schematically illustrate skew adjustment operations performed by the state machines 64, 64'. In particular, according to FIG. 4, the skew limit calculator with skew adjust state machines 64, 64' determine the skews of the eighteen internal clock signals INTCLK[17:0] by evaluating the eighteen groups of 9-bit skew data (DLL_STATEn[8:0]), Block 82. As described herein, each 9-bit skew data value represents a phase of a corresponding clock signal within a 384-step cycle (i.e., a 360° cycle is encoded into 384 steps). Based on these skew data values, the state machines 64, 64' determine a slowest one of the internal clock signals (i.e., the clock signal with greatest lagging skew), Block 84, and determine a fast skew limit, Block 86. As described more fully with respect to FIGS. 5A-5D, this fast skew limit is a threshold skew value that identifies which internal clock signals are too be delayed in time in order to reduce a maximum skew difference between the internal clock signals. For purposes of discussion herein, the fast skew limit will be set at 180° in advance of the identified slowest internal clock signal. Other degrees of advance may also be set.

At least one of the internal clock signals having a skew faster than the fast skew limit is then identified, Block 88, and a delayed version of this "fast" clock signal is generated. As illustrated by Blocks 90 and 92, first data is captured in-sync with the slowest one of the internal clock signals and second data is captured in-sync with the delayed version of the "fast" clock signal. This capture of the first data may represent the initial capture of the first data by the latch elements 54 and the capture of the second data may represent the "recapture" of the second data by the latching units 66.

Figure 5B:
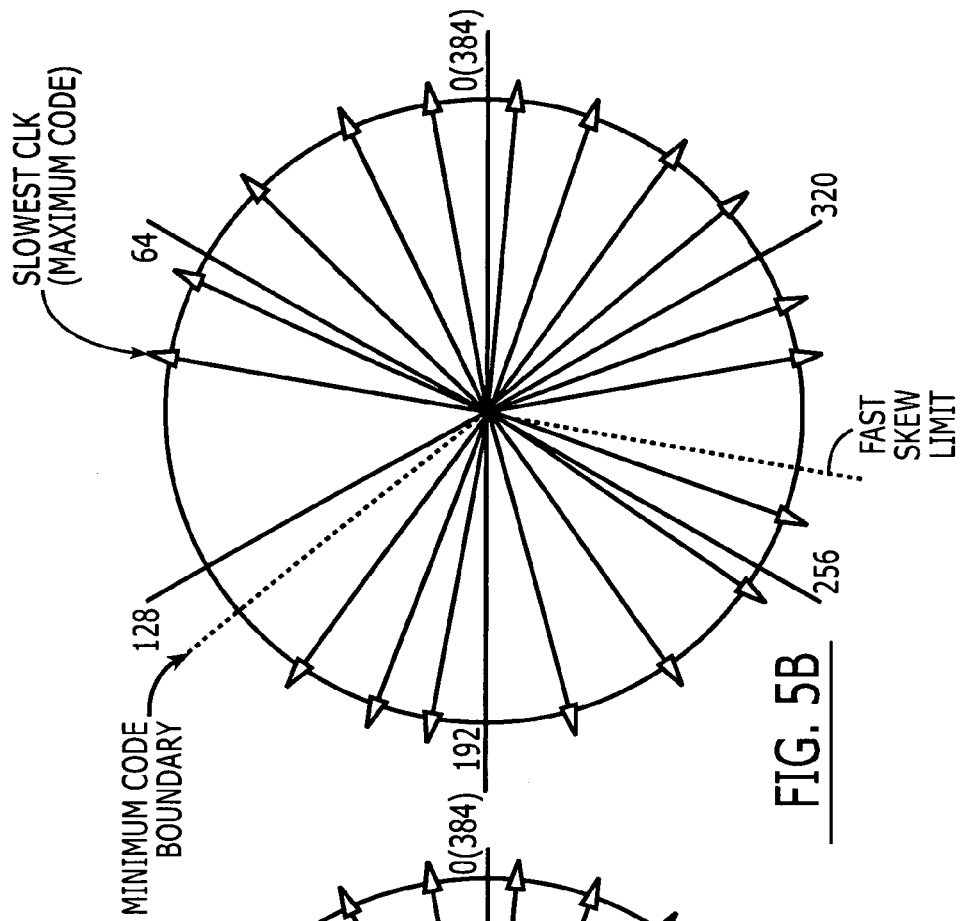
FIGS. 5A-5D are vector diagrams illustrating operation of the skew control circuit of FIG. 3B.
Figure 5A:
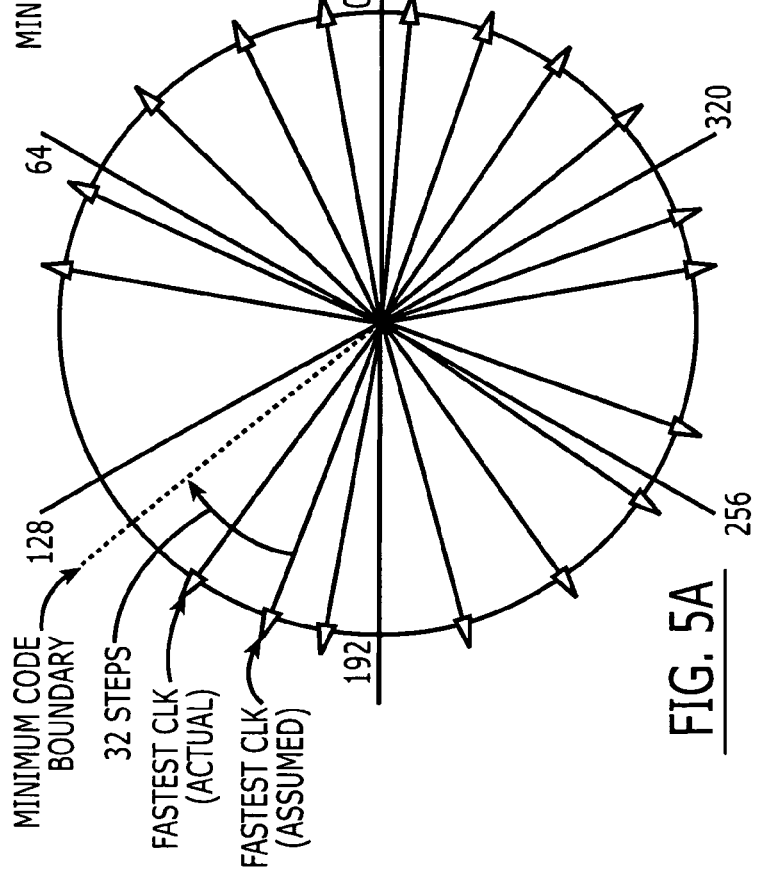
Figure 5D:
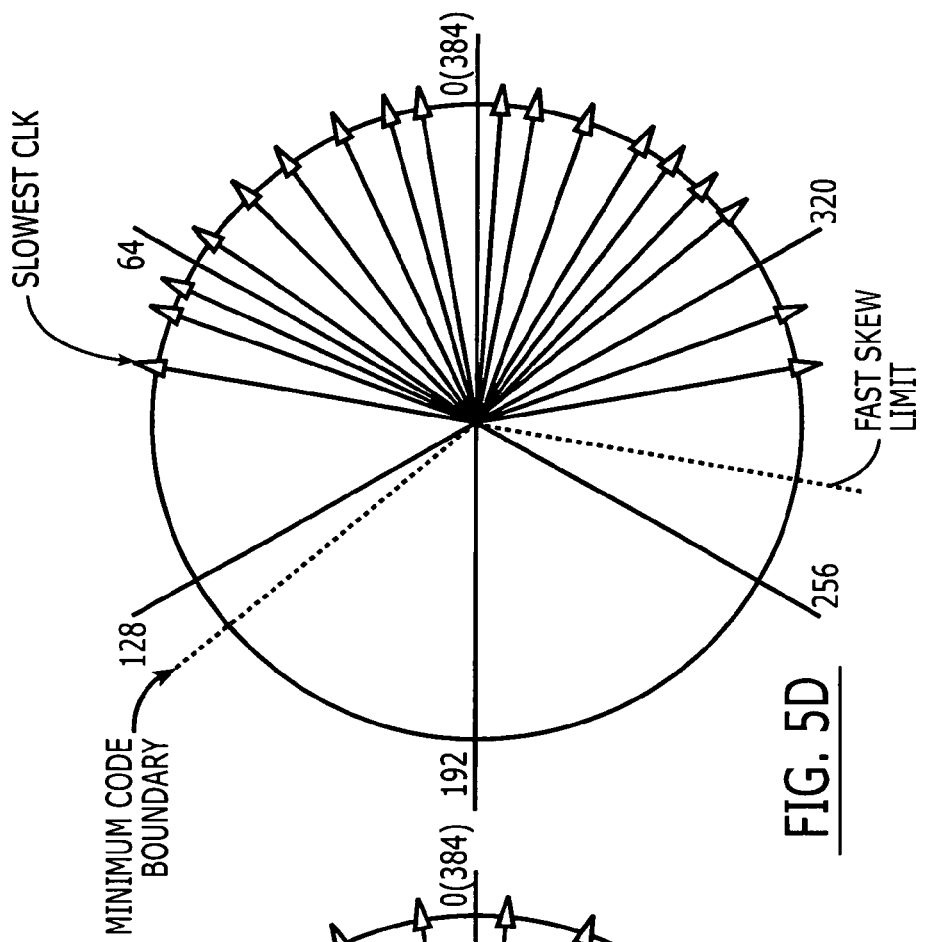

The vector diagrams of FIGS. 5A-5D also illustrate operations highlighted by the flow diagram of FIG. 4. In particular, FIG. 5A is a vector diagram that plots the relative phases of eighteen internal clock signals INTCLK, as determined by the 9-bit skew data values DLL_STATEn[8:0]. These 9-bit values encode 384 possible binary values ranging from 0b to 383b. The phases of these clock signals correspond to the relative skews associated with the plurality of data strobe signals (DQSn[17:0] and /DQSn[17:0]) received at the interface of the integrated circuit device. One of the plurality of data strobe signals is treated as an assumed "fastest" clock signal in order to provide a reference for determining a slowest one of the clock signals based on the 9-bit skew data. A strobe signal may be assumed fastest if it is associated with a device (e.g., DRAM chip) having a closest physical proximity to the interface of the integrated circuit device. A guard band of 32 steps ($2^5$=32) is provided relative to the skew of the "assumed" fastest clock signal in order to set a minimum 9-bit code boundary. This guard band, which may vary in width depending on application, is provided so that a clock signal having a somewhat faster skew relative to the assumed "fastest" clock signal can be properly identified as an actually "fastest" clock signal instead of being incorrectly identified as "slowest" clock signal.

The detection of the 9-bit skew data value associated with an actually fastest clock signal enables the determination of the relative skews of all other clock signals within the group of eighteen, and the identification of a "slowest" clock signal (e.g., one having a maximum 9-bit skew value). As illustrated by FIG. 5B, a "fast skew limit" can be identified in order to set a range of acceptable skews that support accurate recapture of data using a common clock (not shown). For purposes of discussion herein, the "fast skew limit" will be set at 180° in advance of the skew associated with the slowest clock signal, however, other degrees of advance may also be chosen.

Figure 5C:
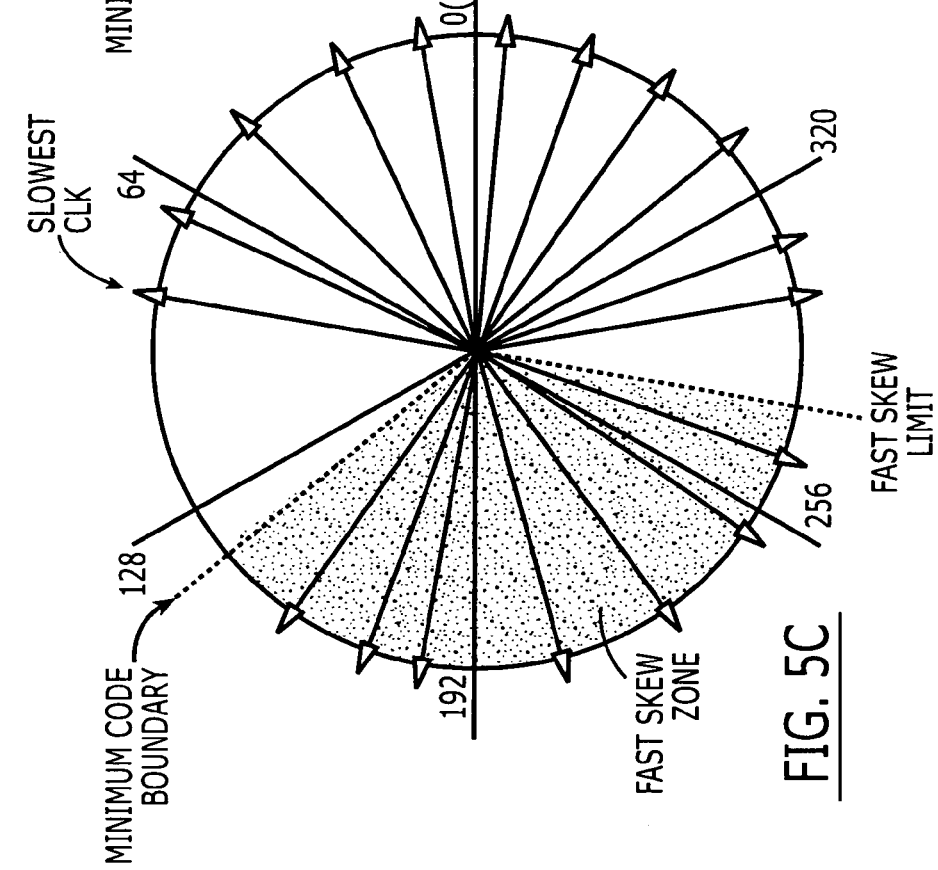

As illustrated by the shaded region in FIG. 5C, a "fast skew zone" identifies internal clock signals having a 9-bit skew value in advance of the "fast skew limit." In response to this identification, the state machine 64 within the skew control circuit 60 generates control signals (DQSKEW_CTLn) to the third phase interpolators 62. These control signals enable the third phase interpolators 62 to generate clock signals ICLK having relative skews that all fall within the narrower 180° skew range identified by FIG. 5D. In this manner, the state machine 64 and third phase interpolators 62 operate to sufficiently "delay" those clock signals within the "fast skew zone" so that all clock signals ICLK have a skew less than the fast skew limit. The state machine 64 also generates eighteen enable signals (DQSKEW_ENn) that represent multiplexer select signals for selecting data stream "A" or stream "B". In particular, the enable signals may be set to a logic 0 value (to select data stream "A") if the corresponding internal clock signal INTCLK is determined to have a skew slower than the fast skew limit or a logic 1 value (to select data stream "B") if the corresponding internal clock signal INTCLK is determined to have a skew within the fast skew zone illustrated by FIG. 5C.

The state machine 64' within the skew control circuit 60' omits the generation of the control signals (DQSKEW_CTLn) because all clock signals ICLK' are generated by simply delaying each of the internal clock signals INTCLK[17:0] by a fixed delay amount (provided by the delay unit 63). This is equivalent to generating each skew of each clock signal illustrated by FIG. 5C by a fixed delay amount. Nonetheless, the state machine 64' generates the eighteen enable signals (DQSKEW_ENn) once those clock signals within the fast skew zone have been identified. This enables data stream "A" or data stream "B" to be selected on a group by group basis (8 data streams per group) in order to achieve a desired degree of skew compression.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
a clock generation circuit configured to generate a plurality of internal clock signals and skew data in response to a plurality of data strobe signals of equivalent frequency received at an interface of the integrated circuit device; and
a data capture circuit configured to capture a plurality of data streams associated with the plurality of data strobe signals, said data capture circuit comprising:
a skew control circuit responsive to the skew data, said skew control circuit configured to determine a fast skew limit in response to identifying a second internal clock signal having a relatively slow skew when compared to a first internal clock signal having a relatively fast skew and further configured to reduce a skew difference between a first data stream associated with the first internal clock signal and a second data stream associated with the second internal clock signal by capturing the first data stream in-sync with a phase-delayed version of the first internal clock signal having a skew that lags the fast skew limit.

2. The integrated circuit device of claim 1, wherein said skew control circuit is configured to identify the second internal clock signal as a clock signal having the greatest lagging skew relative to the first internal clock signal.

3. The integrated circuit device of claim 2, wherein said skew control circuit is configured to determine the fast skew limit as a limit that is 180° in advance of the second internal clock signal.

4. The integrated circuit device of claim 3, wherein said skew control circuit is configured to delay a skew of all of the plurality of internal clock signals having skews in advance of the fast skew limit by 180°.

5. The integrated circuit device of claim 1, wherein said skew control circuit determines the fast skew limit by identifying a slowest one of the plurality of internal clock signals based on the skew data and measuring a fixed number of degrees in advance of the skew associated with the slowest one of the plurality of internal clock signals.

6. The integrated circuit device of claim 5, wherein said skew control circuit is further configured to identify each of the plurality of internal clock signals having a skew in advance of the fast skew limit and generate phase-delayed versions of each of the plurality of internal clock signals identified as having a skew in advance of the fast skew limit.

7. The integrated circuit device of claim 6, wherein the phase-delayed versions of each of the plurality of internal clock signals identified as having a skew in advance of the fast skew limit all have skews that lag the fast skew limit.

8. An integrated circuit device, comprising:
a clock generation circuit configured to generate a plurality of internal clock signals and skew data in response to a plurality of data strobe signals of equivalent frequency received at an interface of the integrated circuit device; and
a data capture circuit configured to capture a plurality of data streams associated with the plurality of data strobe signals, said data capture circuit comprising:
a skew control circuit responsive to the skew data, said skew control circuit configured to identify a slowest one of the plurality of internal clock signals and further configured to reduce a skew difference between a first data stream associated with first one of the plurality of internal clock signals and a second data stream associated with the slowest one of the plurality of internal clock signals by capturing the first data stream in-sync with a phase-delayed version of the first one of the plurality of internal clock signals.

9. A method of reducing skew between a plurality of data streams, comprising the steps of:
determining skews between a plurality of clock signals having equivalent frequency;
identifying a slowest one of the plurality of clock signals;
determining a fast skew limit relative to the slowest one of the plurality of clock signals;
identifying a first one of the plurality of clock signals having a skew that is faster than the slowest one of the plurality of clock signals by a skew amount greater than the fast skew limit;
capturing first data synchronized with the slowest one of the plurality of clock signals; and
capturing second data synchronized with a delayed version of the first one of the plurality of clock signals having a skew less than the fast skew limit.

* * * * *